(12) United States Patent
Inomoto

(10) Patent No.: US 6,204,078 B1
(45) Date of Patent: Mar. 20, 2001

(54) METHOD OF FABRICATING PHOTONIC SEMICONDUCTOR DEVICE USING SELECTIVE MOVPE

(75) Inventor: Yasumasa Inomoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/337,537

(22) Filed: Jun. 22, 1999

(30) Foreign Application Priority Data

Jun. 23, 1998 (JP) .................................................. 10-175925

(51) Int. Cl.[7] .................................................. H01L 21/00
(52) U.S. Cl. .................................................. 438/22; 438/22
(58) Field of Search .................................. 438/22, 39, 41, 438/45, 525, 40

(56) References Cited

U.S. PATENT DOCUMENTS

| | | | | |
|---|---|---|---|---|
| 5,436,195 | * | 7/1995 | Kimura et al. | 437/129 |
| 5,637,511 | * | 6/1997 | Kurihara | 438/39 |
| 5,991,322 | * | 11/1999 | Takiguchi et al. | 372/50 |

FOREIGN PATENT DOCUMENTS

| | | |
|---|---|---|
| 62-139503 | 6/1987 | (JP) . |
| 62-278508 | 12/1987 | (JP) . |
| 62-293686 | 12/1987 | (JP) . |
| 63-33891 | 2/1988 | (JP) . |
| 6-260727 | 9/1994 | (JP) . |
| 6-314657 | 11/1994 | (JP) . |
| 7-176822 | 7/1995 | (JP) . |
| 8-153928 | 6/1996 | (JP) . |
| 9-186391 | 7/1997 | (JP) . |
| 10-75009 | 3/1998 | (JP) . |

* cited by examiner

Primary Examiner—David Nelms
Assistant Examiner—David Nhu
(74) Attorney, Agent, or Firm—McGinn & Gibb, PLLC

(57) ABSTRACT

A method of fabricating a photonic semiconductor device is provided, which is capable of preventing the performance of a fabricated photonic semiconductor device from degrading and its fabrication yield from lowering. In the step (a), a semiconductor substrate having a flat surface is prepared. In the step (b), a dielectric mask layer having an elongated opening is formed on the surface of the substrate. An elongated region of the surface of the substrate is exposed from the mask layer through the elongated opening. In the step (c), a diffraction grating is formed on a part of the elongated region of the surface of the substrate through the opening of the mask layer. In the step (d), semiconductor layers are successively and selectively formed on the elongated region of the surface of the substrate by a selective MOVPE process through the opening of the mask layer, thereby forming a multi-layer, elongated optical waveguide on the surface of the substrate. At least part of the waveguide is located on the part of the elongated region of the surface of the substrate and is contacted with the diffraction grating. In the step (e), the mask layer is removed from the surface of the substrate after the step (d).

15 Claims, 9 Drawing Sheets

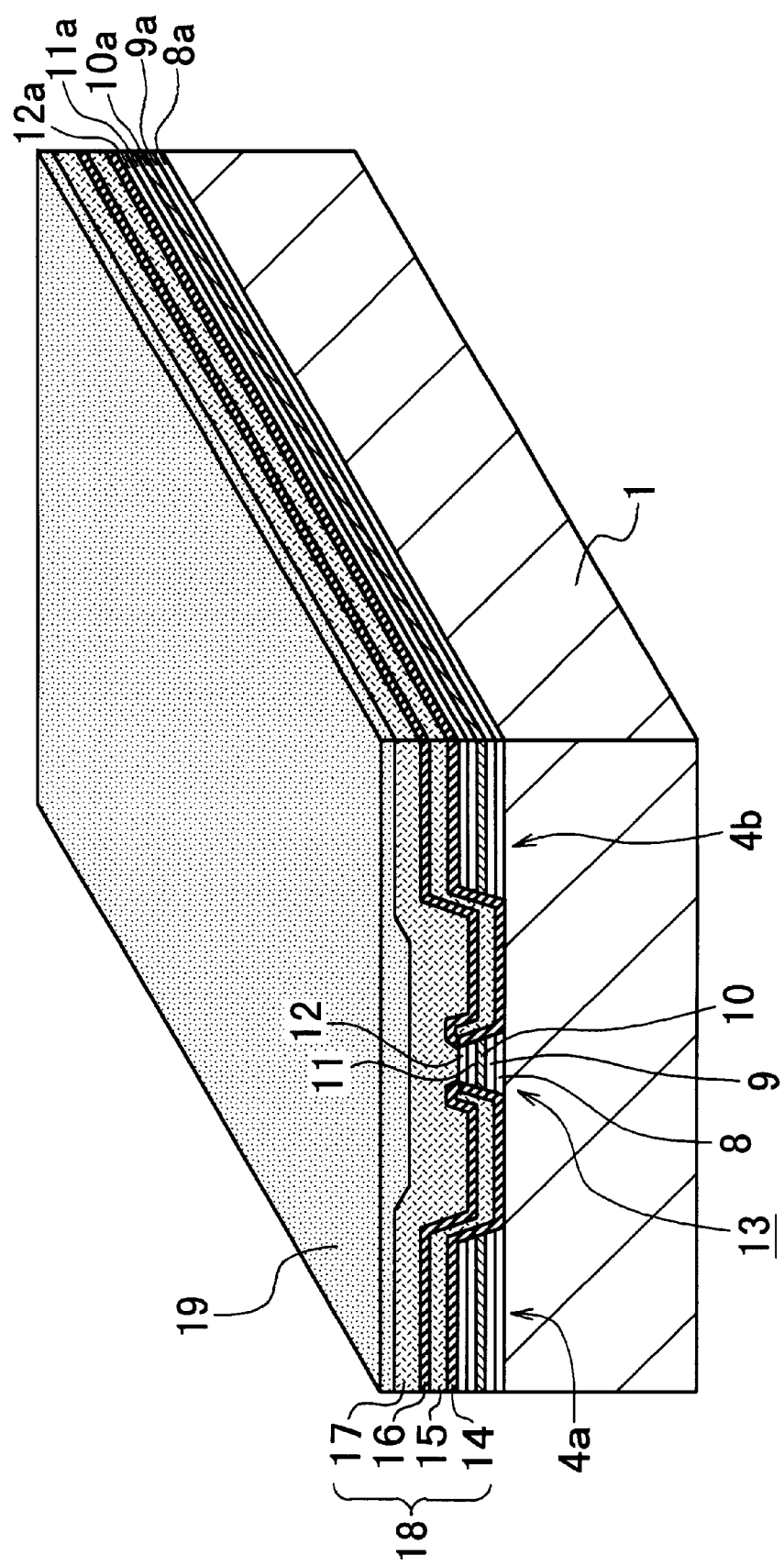

METHOD OF FABRICATING PHOTONIC SEMICONDUCTOR DEVICE USING SELECTIVE MOVPE

BACKGROUND OF THE INVENTION

1. Field of the Invention

The present invention relates to a method of fabricating a photonic semiconductor device such as a laser diode, and more particularly, to a method of fabricating a photonic semiconductor device equipped with a diffraction grating and an optical waveguide on a semiconductor substrate, at least part of the optical waveguide being located on the diffraction grating.

2. Description of the Prior Art

In general, to control accurately the width of an optical waveguide is one of the most important matters for ensuring the desired performance and fabrication yield of a photonic semiconductor device. As one of the methods realizing such accurate control, the selective Metal-Organic Vapor Phase Epitaxy (MOVPE) has been known well and practically used.

In the MOVPE process, first, a dielectric mask layer, which is, for example, made of silicon dioxide ($SiO_2$), is formed on a flat surface of a semiconductor substrate. The mask layer has a strip-shaped window that exposes a desired part of the flat surface of the substrate. Next, specific semiconductor layers are selectively and successively grown through the strip-shaped window on the exposed part of the surface using the selective MOVPE process, thereby forming a strip-shaped optical waveguide with a multilayer structure on the flat surface of the substrate. The optical waveguide (i.e., the stacked semiconductor layers) has a strip-like plan shape corresponding to that of the window of the mask layer and extends along the surface of the substrate. Thereafter, the dielectric mask layer is removed.

As seen from the above explanation, when the selective MOVPE process is used, the accuracy of the width of the optical waveguide is determined by the accuracy of the strip-shaped window of the dielectric mask layer, in other words, the accuracy of a patterning process for the mask layer.

A possible accuracy of the patterning process for the dielectric mask layer is approximately ±0.1 μm, which is approximately equal to that of patterning processes used in popular semiconductor device fabrication. Therefore, when the selective MOVPE process is used, there is an advantage that the controllability of the width of the waveguide can be remarkably improved, compared with a case where stacked semiconductor layers are formed on a flat surface of a semiconductor substrate and then, the stacked semiconductor layers are patterned to form an optical waveguide. Because of the advantage of excellent controllability, the selective MOVPE process has been popularly used in fabrication of miniaturized photonic semiconductor devices such as laser diodes.

An example of the prior-art methods of fabricating a photonic semiconductor device using the selective MOVPE process is schematically shown in FIGS. 1A and 1B, which fabricates a Distributed-FeedbBack (DFB) type semiconductor laser device equipped with a laser element and an optical modulator element formed on a semiconductor substrate. This prior-art method is disclosed in the Japanese Non-Examined Patent Publication No. 7-176822 published in July 1995.

In the prior-art method shown in FIGS. 1A and 1B, first, a patterned resist film (not shown) is formed on a flat surface of an n-type indium phosphide (InP) substrate 101. The patterned resist film is usually obtained by electron-beam (EB) exposure and development. Next, using the patterned resist film as a mask, the flat surface of the InP substrate 101 is selectively etched, forming parallel grooves on a desired part of the flat surface of the substrate 101, as shown in FIG. 1A. The grooves, which are arranged at regular intervals, constitute a diffraction grating 102.

At this stage, the flat surface of the substrate 101 is divided into two areas, a grooved area 105 and a non-grooved, flat area 106, due to the formation of the diffraction grating 102. The grooves or grating 102 are located in only the groove area 105.

Subsequently, a $SiO_2$ layer (not shown) is deposited on the whole surface of the substrate 101 and then, it is patterned by etching using a patterned photoresist film as a mask. The patterned photoresist film is usually obtained by photolithography. The patterned $SiO_2$ layer thus foamed on the flat surface of the substrate 101 serves as a growth-inhibiting mask layer 107 shown in FIG. 1B. The mask layer 107 has a pair of strip-like masking parts 107a and 107b and a strip-shaped window 108 intervening between the masking parts 107a and 107b. The masking parts 107a and 107b and the window 108 extend over not only the flat area 106 but also the grooved area 105. The width of the masking parts 107a and 107b in the grooved area 105 is larger than that in the flat area 106.

Thereafter, using the growth-inhibiting mask layer 107, specific semiconductor layers (not shown) are selectively and successively grown through the window 108 on the flat surface of the substrate 101 by a selective MOVPE process, forming a strip-shaped optical waveguide (not shown) with a multilayer structure on the exposed surface of the substrate 101. The optical waveguide (i.e., the stacked semiconductor layers) has a strip-shaped plan shape corresponding to that of the window 108 of the mask layer 107 and extends along the surface of the substrate 101. Thereafter, the mask layer 107 is removed.

Finally, specified semiconductor and dielectric layers (not shown) are successively formed to cover the strip-shaped optical waveguide and then, specified electrodes (not shown) are formed, completing a DFB type semiconductor laser device with an incorporated optical modulator element.

The Japanese Non-Examined Patent Publication Nos. 6-314657 published in November 1994 and 9-186391 published in July 1997 disclose similar prior-art fabrication methods to that shown in FIGS. 1A and 1B.

With the prior-art method of fabricating a photonic semiconductor device shown in FIGS. 1A and 1B, after the diffraction grating 102 is formed on the flat surface of the substrate 101, the $SiO_2$ layer is deposited thereon and patterned to form the dielectric mask layer 107. Thus, there is a problem of performance degradation of the fabricated photonic device and low fabrication yield thereof, the reason of which is as follows.

First, since the $SiO_2$ layer for the masking layer 107 is formed directly on the diffraction grating 102 in the grooved area 105 of the substrate 101, the level of flatness of the $SiO_2$ layer in the grooved area 105 is lower than that in the flat area 106 due to existence of the grating 102. Accordingly, when the resist film is formed on the $SiO_2$ layer for the purpose of patterning the same, the resist film is liable to have excessive or intolerable fluctuation in thickness in the grooved area 105 due to the low-level flatness of the $SiO_2$ layer.

Also, since the low-level flatness of the $SiO_2$ layer for the mask layer 107 lowers its adherence to the overlying resist film, a so-called side-etch rate will increase in the etching or patterning process of the $SiO_2$ layer.

As a result, the etching or patterning accuracy of the $SiO_2$ layer in the grooved area 105 is lower than that in the flat area 106, which increases the deviation in the width of the window 108 of the mask layer 107 in the grooved area 105. This width deviation of the window 108 will increase the deviation in the width of the optical waveguide in the grooved area 105, resulting in the above-described problem that the performance of the fabricated photonic device (e.g., degradation of the light-emitting characteristics of the laser element) is degraded and its fabrication yield is lowered.

Second, the etching or patterning accuracy of the $SiO_2$ layer for the mask layer 107 is not lowered in the flat area 106 and therefore, considerable difference will occur in the etching or patterning accuracy of the $SiO_2$ layer between the grooved and flat areas 105 and 106. Accordingly, the width of the strip-shaped window 108 of the mask layer 107 will have a considerable difference at the boundary between these two areas 105 and 106. This width difference of the window 108 will generate some deviation in the width of the resultant optical waveguide at the boundary between the areas 105 and 106, resulting in the above-described problem that the performance of the fabricated photonic device (e.g., generation of non-uniform electric field and/or increase in transmission or propagation loss) is degraded and its fabrication yield is lowered.

SUMMARY OF THE INVENTION

Accordingly, an object of the present invention to provide a method of fabricating a photonic semiconductor device capable of preventing the performance of a fabricated photonic semiconductor device from degrading and its fabrication yield from lowering.

Another object of the present invention to provide a method of fabricating a photonic semiconductor device capable of suppressing the optical-coupling loss between adjacent photonic elements incorporated into the photonic semiconductor device.

The above objects together with others not specifically mentioned will become clear to those skilled in the art from the following description.

A method of fabricating a photonic semiconductor device according to the present invention is comprised of the following steps of (a) to (e).

In the step (a), a semiconductor substrate having a flat surface is prepared.

In the step (b), a dielectric mask layer having an elongated opening is formed on the surface of the substrate. An elongated region of the surface of the substrate is exposed from the mask layer through the elongated opening.

In the step (c), a diffraction grating is formed on a part of the elongated region of the surface of the substrate through the opening of the mask layer.

In the step (d), semiconductor layers are successively and selectively formed on the elongated region of the surface of the substrate by a selective MOVPE process through the opening of the mask layer, thereby forming a multi-layer, elongated optical waveguide on the surface of the substrate. At least part of the waveguide is located on the part of the elongated region of the surface of the substrate and is contacted with the diffraction grating.

In the step (e), the mask layer is removed from the surface of the substrate after the step (d).

With the method of fabricating a photonic semiconductor device according to the present invention, the dielectric mask layer having the elongated opening is formed on the flat surface of the semiconductor substrate in the step (b) and then, the diffraction grating is formed on the part of the elongated region of the flat surface of the substrate through the elongated opening of the mask layer in the step (c). Thereafter, the semiconductor layers are successively and selectively formed on the exposed, elongated region of the surface of the substrate by a selective MOVPE process through the opening of the mask layer, thereby forming the multi-layer, elongated optical waveguide on the surface of the substrate in the step (d). At least the part of the waveguide is located on the part of the elongated region of the surface of the substrate and is contacted with the diffraction grating. Thus, the dielectric mask layer is entirely formed on the flat surface of the substrate prior to the formation of the diffraction grating and as a result, the whole mask layer is flat, i.e., the level of flatness of the mask layer is satisfactorily high.

Accordingly, when a dielectric layer for the dielectric mask layer is patterned using a patterned resist film, located on the same dielectric layer, the resist film has no excessive or intolerable fluctuation in thickness over the whole elongated region of the surface of the substrate. Again, when the dielectric layer for the dielectric mask layer is patterned by etching, no side-etch rate increases. This means that the performance of the fabricated photonic semiconductor device due to the fluctuation in thickness of the resist film and the increase in side-etch rate is prevented from degrading without lowering its fabrication yield.

Moreover, since the dielectric mask layer is entirely formed flat, the patterning accuracy of the whole mask layer is constant. Thus, the width of the elongated opening of the mask layer has no considerable difference at the end or boundary of the diffraction grating. Accordingly, the performance of the fabricated photonic semiconductor device is prevented from degrading due to the considerable difference in width of the elongated opening of the mask layer and at the same time, the lowering of the fabrication yield of the device is prevented.

In a preferred embodiment of the method according to the present invention, the optical waveguide is formed in such a way that only the part of the waveguide is located on the diffraction grating in the step (d). The part of the waveguide located on the grating serves as part of a laser element. In this embodiment, the performance degradation and fabrication yield lowering of the laser element with the diffraction crating can be prevented from occurring.

In another preferred embodiment of the method according to the present invention, the optical waveguide is formed in such a way that only the part of the waveguide is located on the diffraction grating in the step (d). The part of the waveguide located on the grating serves as part of a first photonic element and a part of the waveguide located outside the grating serves as part of a second photonic element. The first photonic element is a laser element and the second photonic element is one other than a laser element. In this embodiment, the performance degradation and fabrication yield lowering of the combination of the laser element with the diffraction grating and the other photonic element can be prevented from occurring. There is an additional advantage that the optical-coupling loss between the first and second photonic elements incorporated into the photonic semiconductor device can be suppressed.

In still another preferred embodiment of the method according to the present invention, the step (b) of forming the dielectric mask layer is carried out by (i) forming a dielectric layer on the flat surface of the substrate, (ii) forming a patterned resist film on the dielectric layer formed on the surface of the substrate, and (iii) etching the dielectric layer using the patterned resist film as a mask. In this embodiment, the advantage of the present invention is exhibited more effectively.

In a further preferred embodiment of the method according to the present invention, an InP substrate is used as the substrate and one of an oxide and a nitride of silicon is used as the dielectric mask layer. This is because an InP substrate is popularly used as the substrate and an oxide or a nitride of silicon is popularly used as the dielectric mask layer. In this embodiment, the above-described problems can be readily solved.

It is preferred that the elongated opening of the dielectric mask layer has a width of approximately 2 $\mu$m or less. This is because the method according to the present invention is more effective for an optical waveguide with such a narrow width as approximately 2 $\mu$m or less, and because the selective MOVPE process is more effective for the process of forming an optical waveguide through such the narrow opening as above.

In the method according to the present invention, the term "semiconductor substrate" has a wide meaning. Specifically, it may be constituted by a semiconductor substrate itself (i.e., a semiconductor substrate made of a single semiconductor material), or may be a combination of a semiconductor substrate and at least one layer formed thereon, if it has a flat surface on which the optical waveguide is provided.

BRIEF DESCRIPTION OF THE DRAWINGS

In order that the present invention may be readily carried into effect, it will now be described with reference to the accompanying drawings.

FIGS. 2A to 2E are schematic perspective views showing a method of fabricating a photonic semiconductor device according to a first embodiment of the present invention, respectively.

DETAILED DESCRIPTION OF THE PREFERRED EMBODIMENTS

Figure 1A:
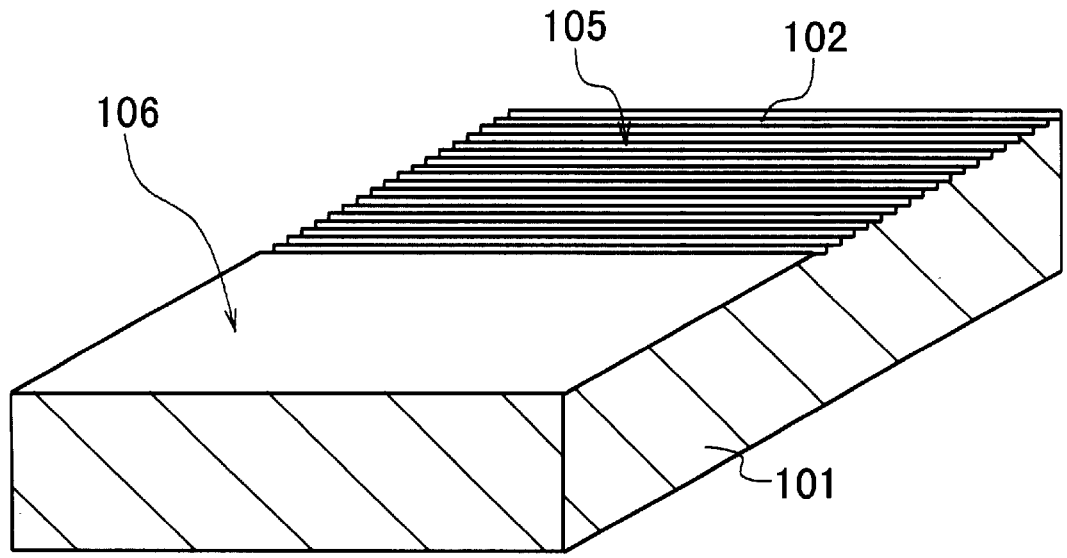
FIGS. 1A and 1B are schematic perspective views showing a prior-art method of fabricating a photonic semiconductor device, respectively.

Preferred embodiments of the present invention will be described in detail below while referring to the drawings attached.

First Embodiment

A method of fabricating a photonic semiconductor device according to a first embodiment of the present invention is comprised of the process steps as shown in FIGS. 2A to 2E. In this embodiment, a DFB-type semiconductor laser device designed for analog data transmission is fabricated.

Figure 2A:
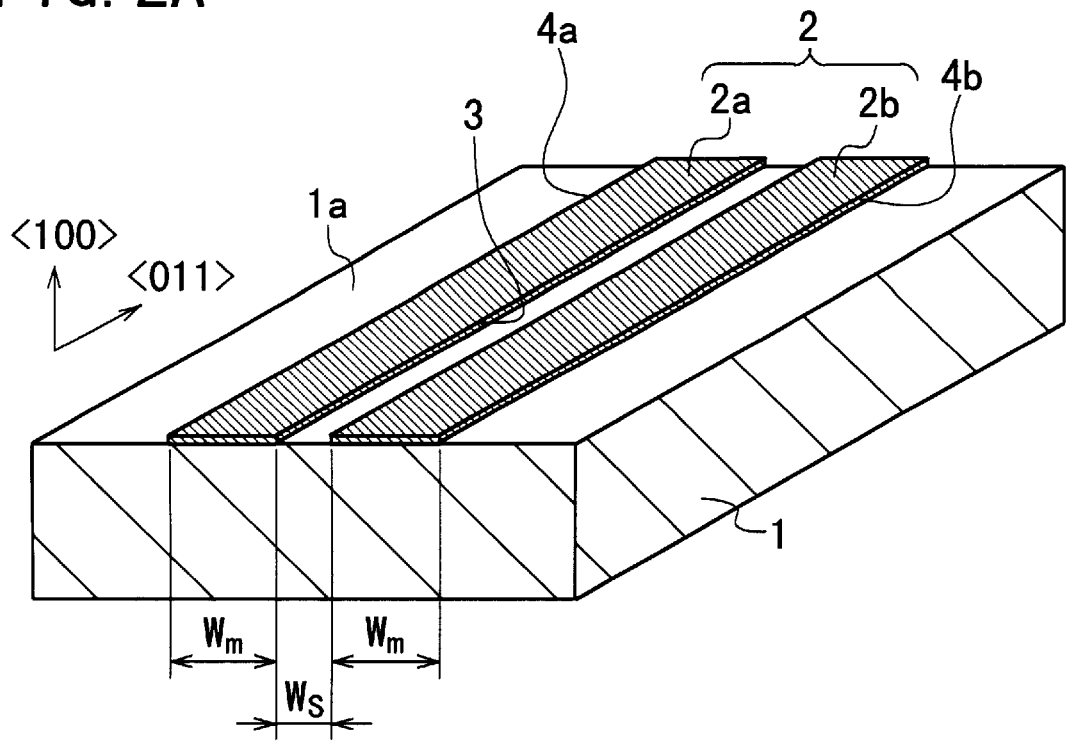

First, as shown in FIG. 2A, an n-type InP substrate 1 having a (100)-oriented flat surface 1a is prepared. Then, a SiO$_2$ layer (not shown) with a thickness of 150 nm is deposited on the surface 1a by a known thermal Chemical Vapor Deposition (CVD) process. Using a patterned photoresist film (not shown) obtained by known photolithography, the SiO$_2$ layer is patterned by wet etching, thereby forming a growth-inhibiting mask layer 2 made of SiO$_2$ on the flat surface 1a of the substrate 1. The state at this stage is shown in FIG. 2A.

The growth-inhibiting mask layer 2 has a pair of strip-shaped masking parts 2a and 2b extending along the <011> direction and a strip-shaped opening 3 located between the masking parts 2a and 2b. The opening 3 extends along the same direction as that of the parts 2a and 2b. The task layer 2 further has two openings 4a and 4b located at each side of the opening 3. The flat surface 1a of the substrate 1 is exposed from the masking layer 2 through the openings 3, 4a, and 4b.

The elongated masking parts 2a and 2b and the elongated opening 3 are kept constant in width over their whole length. Here, the masking parts 2a and 2b have an equal width $W_m$ of 3 $\mu$m and the opening 3 has a width $W_s$ of 1.5 $\mu$m.

Figure 2B:
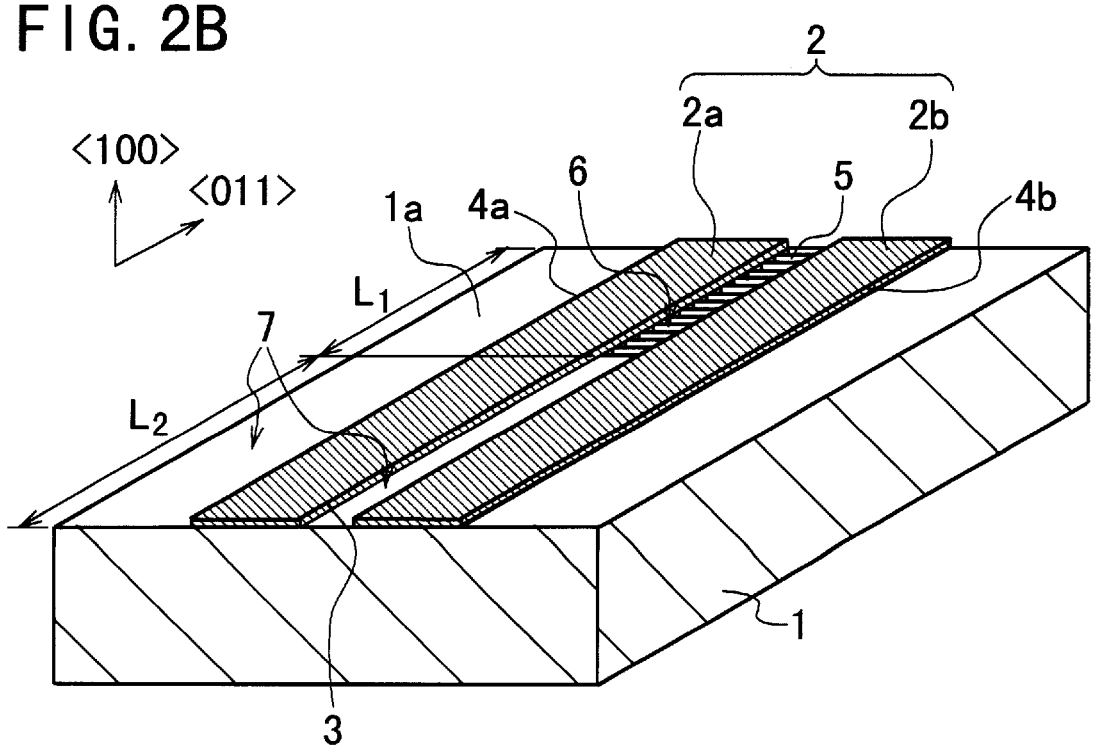

Subsequently, an electron-beam (EB) resist film (not shown) is formed on the whole surface 1a of the substrate 1 while covering the masking layer 2. The EB resist film is patterned by known EB exposure and development processes. Using the EB resist film thus patterned, a corresponding part of the surface 1a of the substrate 1 is directly and selectively etched by a wet etching process through the opening 3 of the mask layer 2, forming parallel grooves on the elongated region of the surface 1a exposed through the elongated opening 3 of the mask layer 2. The grooves, which are arranged at regular intervals along the surface 1a, extend perpendicular to the elongated opening 3 and the <011> direction. These grooves constitute a diffraction grating 5, as shown in FIG. 2B. Thus, the diffraction grating 5 is selectively formed or the elongated region of the surface 1a through the opening 3. The state at this stage is shown in FIG. 2B.

The area of the surface 1a on which the grating 5 is formed is termed a "grooved area 6". On the other hand, the remaining area of the surface 1a on which the grating 5 is not formed is termed a "flat area 7", because it is left flat.

Here, the grooved area 6 has a length $L_1$ of 100 $\mu$m along the <011> direction and the flat area 7 has a length $L_2$ of 200 $\mu$m along the same direction, resulting in the total length of the photonic semiconductor device being 300 $\mu$m along the <011> direction. The period of the grooves forming the grating 5 is 202.7 nm.

Figure 2C:
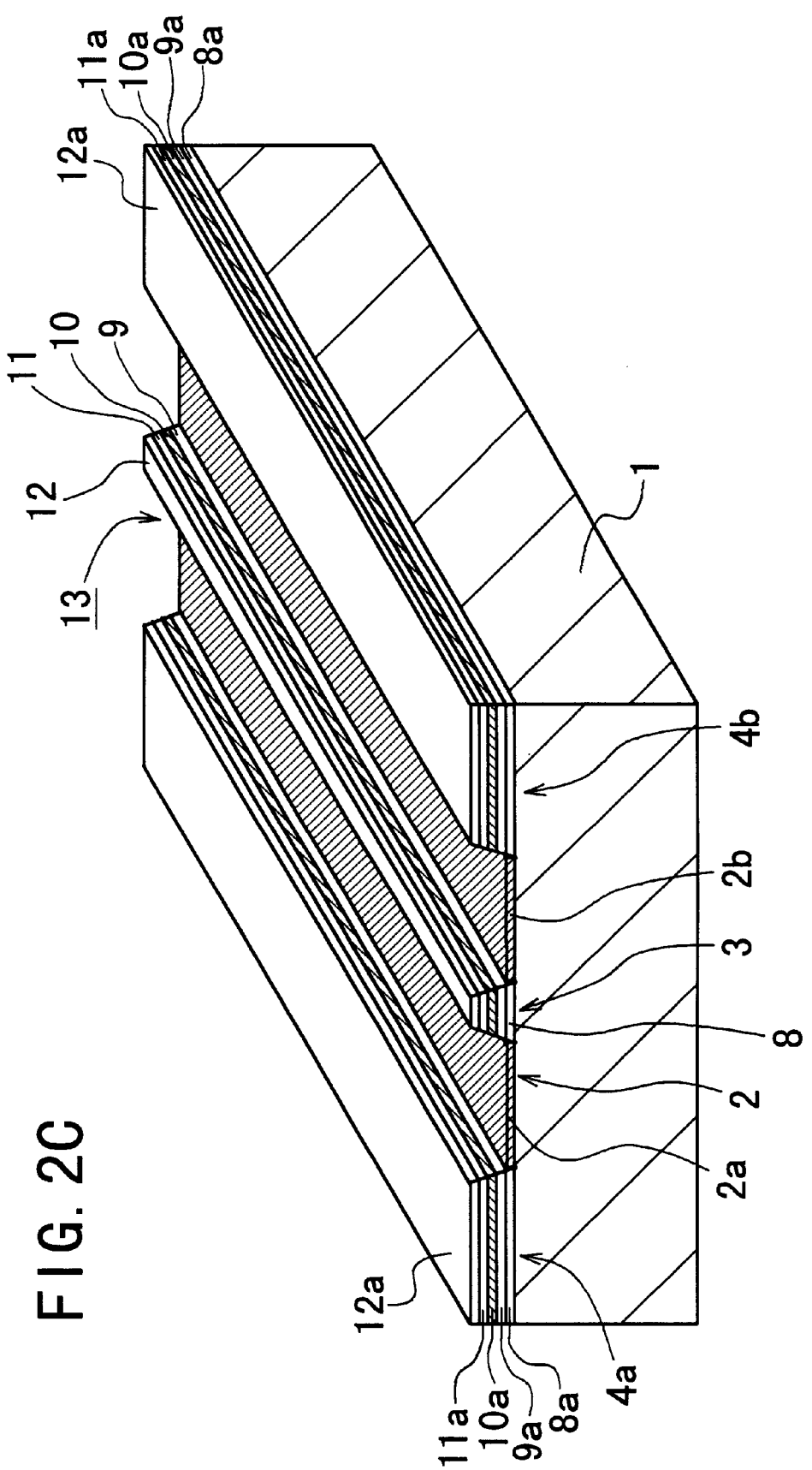

Further, by a selective MOVPE process using the mask layer 2, an n-type InGaAsP guiding layer 8, an n-type InP spacer layer 9, an undoped InGaAsP Multi-Quantum Well (MQW) active layer 10, an undoped InGaAsP optically confining layer 11, and a p-type InP cladding layer 12 are selectively and successively grown on the exposed flat surface 1a of the substrate 1 from the mask layer 2. Thus, as shown in FIG. 2C, a multilayer optical waveguide 13 with a mesa structure is formed on the elongated region of the surface 1a of the substrate 1. This MOVPE process is performed in a growth chamber held at a pressure of 75 Torr at a growth temperature of 625° C.

The n-type InGaAsP guiding layer 8 has a thickness of 0.1 $\mu$m, a carrier concentration of $1\times10^{18}$ cm$^{-3}$, and a bandgap wavelength of 1.05 $\mu$m. The n-type InP spacer layer 9 has a thickness of 0.02 $\mu$m and a carrier concentration of $1\times10^{18}$ cm$^{-3}$. The undoped InGaAsP MQW active layer 10 is formed by InGaAsP well sublayers and InGaAsP barrier layers stacked alternately at seven periods. Each of the well sublayers has a thickness of 5 nm, a bandgap wavelength of 1.31 $\mu$m, and a strain of 0.7%. Each of the barrier sublayers has a thickness of 10 nm and a bandgap wavelength of 1.05

μm. The undoped InGaAsP optically confining layer 11 has a thickness of 90 nm and a bandgap wavelength of 1.05 μm. The p-type InP cladding layer 12 has a thickness of 0.1 μm and a carrier concentration of $5×10^{17}$ cm$^{-3}$.

As seen from FIG. 2C, an n-type InGaAsP layer 8a, an n-type InP spacer layer 9a, an undoped InGaAsP MQW layer 10a, an undoped InGaAsP layer 11a, and a p-type InP layer 12a are selectively grown on the exposed areas of the surface 1a from the openings 4a and 4b of the mask layer 2, along with the optical waveguide 13. These layers 8a, 9a, 10a, 11a, and 12a are equal in configuration and composition to the layers 8, 9, 10, 11, and 12 forming the waveguide 13, respectively.

A SiO$_2$ layer (not shown) with a thickness of 350 nm is deposited on the layered structure of the substrate 1 shown in FIG. 2C by a thermal CVD process. The SiO$_2$ layer is then patterned by a wet etching process using a patterned photoresist film (not shown) obtained by a photolithography technique, thereby forming a mask layer (not shown) made of SiO$_2$. This SiO$_2$ mask layer has a masking part covering only the cladding layer 12 located at the top of the waveguide 13. Through this wet etching process for patterning the SiO$_2$ layer, the growth-inhibiting mask 2 is removed from the surface 1a of the substrate 1.

Using the SiO$_2$ mask layer thus formed, a p-type InP layer 14, an n-type InP layer 15, and a p-type InP layer 16 are selectively and successively grown over the substrate 1 by a selective MOVPE process, as shown in FIG. 2D. This MOVPE process is performed in the same growth chamber held as above at the same pressure of 75 Torr at the same growth temperature of 625° C. These layers 14, 15 and 16 cover the entire surface 1a of the substrate 1 except for the cladding layer 12 located at the top of the waveguide 13.

The p-type InP layer 14 has a thickness of 0.3 μm and a carrier concentration of $5×10^{17}$ cm$^{-3}$. The n-type InP layer 15 has a thickness of 1 μm and a carrier concentration of $1×10^{18}$ cm$^{-3}$. The p-type InP layer 16 has a thickness of 0.2 μm and a carrier concentration of $5×10^{17}$ cm$^{-3}$.

After the growth of the layers 14, 15, and 16 is completed, the SiO$_2$ mask layer for these layers 14, 15, and 16 is removed by etching.

Moreover, using a MOVPE process performed in the same growth chamber held as above at the same pressure of 75 Torr at the same growth temperature of 625° C., a p-type InP layer 17 with a thickness of 1.5 μm and a carrier concentration of $1×10^{18}$ cm$^{-3}$ is grown on the p-type InP layer 16. The p-type InP layer 17 covers the whole surface 1a of the substrate 1.

Thus, as shown in FIG. 2D, as current blocking layer 18, which has a thyristor configuration, is formed by the p-type InP layer 14, the n-type InP layer 15, the p-type InP layer 16, and the p-type InP layer 17.

Using a MOVPE process performed in the same growth chamber as above, a p-type InGaAs cap layer 19 with a thickness of 0.2 μm and a carrier concentration of $5×10^{18}$ cm$^{-3}$ is grown on the p-type InP layer 17. The cap layer 19 covers the whole surface 1a of the substrate 1. Thus, necessary crystal growth process are completed. The state at this stage is shown in FIG. 2D.

Figure 2E:
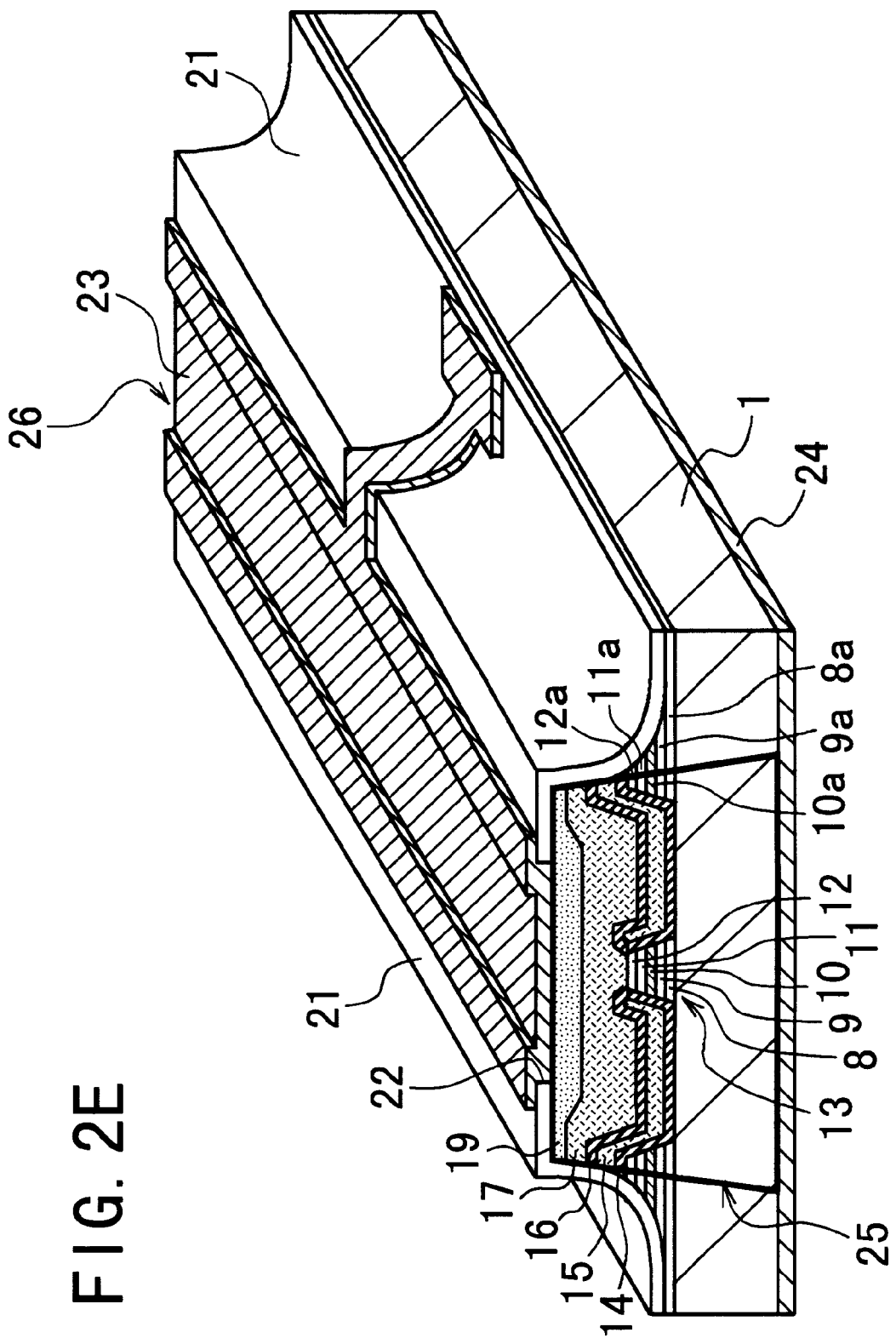

Following this, the InP layer 9a, the MQW active layer 10a, the InGaAsP layer 11a, the InP layer 12a, the current blocking layer 18a, and the cap layer 19a, which are located at each side of the waveguide 13, are patterned by known photolithography and wet etching techniques, resulting in a mesa-stripe structure on the surface 1a of the substrate 1, as shown in FIG. 2E.

A SiO$_2$ layer 21 with a thickness of 350 nm is deposited on the mesa-stripe structure thus produced by a thermal CVD process, covering the top and both side faces of the mesa-stripe structure. The layer 21 is patterned by wet etching using a photoresist film patterned by a photolithography, thereby forming a contact opening 22 exposing the top of the mesa-stripe structure in the layer 21. The contact opening 22, which is strip-shaped, extends along the waveguide 13 in the <011> direction.

On the SiO$_2$ layer 21 thus patterned, a titanium (Ti) film with a thickness of 100 nm and a gold (Au) film with a thickness of 300 nm are successively deposited by sputtering. The Ti and Au films are simultaneously patterned by wet etching using a photoresist film patterned by a photolithography, forming a pad-shaped p-side electrode 23 on the cap layer 19. The p-side electrode 23 is contacted and electrically connected with the InGaAs cap layer 19 through the opening 22 of the SiO$_2$ layer 21.

The back surface of the substrate 1, which is opposite to the flat surface 1a, is polished until the resultant thickness of the substrate 1 is equal to a desired value of 90 μm. A Ti film with a thickness of 100 nm and a Au film with a thickness of 300 nm are successively deposited on the back surface by sputtering. The Ti and Au films are simultaneously patterned by wet etching using a photoresist film patterned by a photolithography, forming an n-side electrode 24. The n-side electrode 24 is contacted and electrically connected with the back surface of the substrate 1.

Thereafter, the substrate 1 having the above-described mesa-stripe structure is sintered in a nitrogen (N$_2$) atmosphere, completing the semiconductor laser device.

Only one laser device is provided on the substrate 1 in the above explanation and FIGS. 2A to 2E for the sake of simplification of description. However, practically, a lot of same laser devices are provided on the same substrate 1. Therefore, finally, the substrate 1 is cloven along the specific lines to separate the individual laser devices from one another. In each of the laser devices, the opposite end face of the diffraction grating 5 of the waveguide 13 is covered with a high-reflectance film 25 with a reflectance of 70% and at the same time, the same end face as the diffraction grating 5 of the waveguide 13 is covered with a low-reflectance film 26 with a reflectance of 1%. Thus, the DFB-type semiconductor laser device having the diffraction grating 5 at the part of the waveguide 13 shown in FIG. 2E is completed.

With the method of fabricating a photonic semiconductor device according to the first embodiment of the present invention, as explained above, the SiO$_2$ mask layer 2 having the elongated opening 3 is formed on the flat surface 1a of the substrate 1 and then, the diffraction grating 5 is formed on the part (i.e., the grooved area 6) of the elongated region of the flat surface 1a through the opening 3 of the mask layer 2, as shown in FIG. 2B. No diffraction grating is formed on the flat area 7 of the surface 1a.

Thereafter, the semiconductor layers 8, 9, 10, 11, and 12 are successively and selectively formed on the exposed, elongated region of the surface 1a of the substrate 1 through the elongated opening 3 of the mask layer 2 using a selective MOVPE process, thereby forming the multi-layer, strip-shaped optical waveguide 13 on the substrate 1. The waveguide 13 extends along the surface 1a of the substrate 1. A part of the waveguide 13 is located on the grooved area 6 of the surface 1a and is contacted with the diffraction grating 5.

Thus, the mask layer 2 for forming the waveguide 13 is entirely formed on the flat surface 1a of the substrate 1 before the diffraction grating 5 is formed, resulting in the whole mask layer 2 being flat.

Accordingly, when a dielectric layer for the mask layer 2 is patterned using a patterned resist film located on the same dielectric layer, the resist film has no excessive or intolerable fluctuation in thickness in the whole elongated region of the surface 1a of the substrate 1 for the waveguide 13. Again, when the dielectric layer for the mask layer 2 is patterned by etching, no side-etch rate increases. This means that the performance of the fabricated photonic semiconductor device is prevented from being degraded without lowering the fabrication yield of the device.

Moreover, since the whole mask layer 2 is formed flat, the patterning accuracy of the mask layer 2 is entirely constant. Thus, the width of the elongated opening 3 of the mask layer 2 has no considerable difference at the boundary between the grooved and flat areas 5 and 6 of the surface 1a of the substrate 1. Accordingly, the performance of the fabricated photonic semiconductor device is prevented from being degraded due to the considerable difference in the width of the opening 3 of the mask layer 2 and at the same time, the lowering of the fabrication yield of the device is prevented.

For example, even if the waveguide 13 does not have a specific, desired value, neither performance degradation of the laser nor its fabrication yield lowering will occur. Also, since the width of the waveguide 13 is not discontinuously changed at the boundary of the grooved and flat areas 6 and 7, scattering and reflection of the propagating light in the waveguide 13 are not generated due to this discontinuity of the width. Accordingly, the electric-field distribution is uniform over the whole length of the waveguide 13, resulting in good analog data transmission characteristics. This means that the possible performance of the DFB-type semiconductor laser device is fully derived or utilized.

To confirm the advantages of the method according to the first embodiment, the inventor practically fabricated the photonic semiconductor device in the same way as described and tested the analog data transfer characteristics and static characteristics of the device. As a result, the secondary inter-modulation distortion was −65 dBc at an optical output of 30 mW. This value means that the device fabricated by the method according to the first embodiment was improved by 10 dB or more compared with a device fabricated by the prior-art method shown in FIGS. 1A and 1B.

Figure 1B:
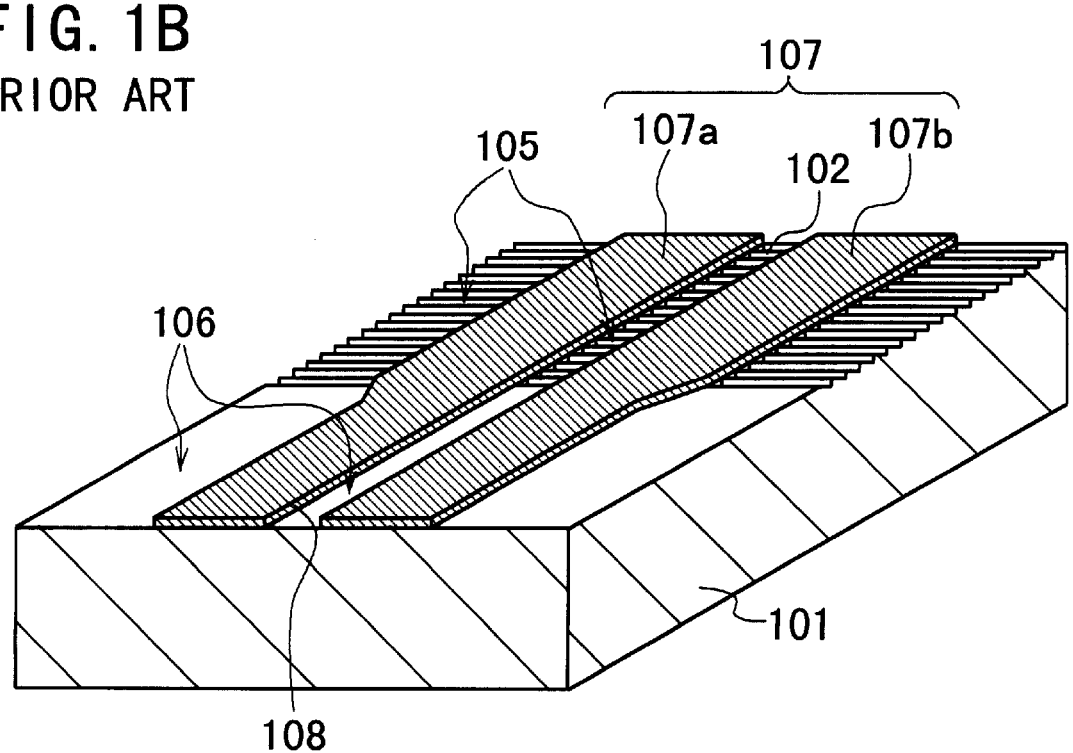

Also, regarding the static characteristics, the threshold current for laser oscillation was 10 mA and the slope efficiency was 0.58 W/A, which were approximately equal to those obtained in the prior-art method shown in FIGS. 1A and 1B.

The diffraction grating 5 is partially formed on the grooved area 6 in the method according to the first embodiment. However, it is needless to say that the grating 5 may be formed on the entire elongated region of the surface 1a of the substrate 1 exposed through the strip-shaped opening 3 of the mask layer 2.

Second Embodiment

FIGS. 3A to 3E show a method of fabricating a photonic semiconductor device according to a second embodiment of the present invention. In this embodiment, a DFB-type semiconductor laser device equipped with an electric-field absorption type optical modulator element is fabricated.

Figure 3A:
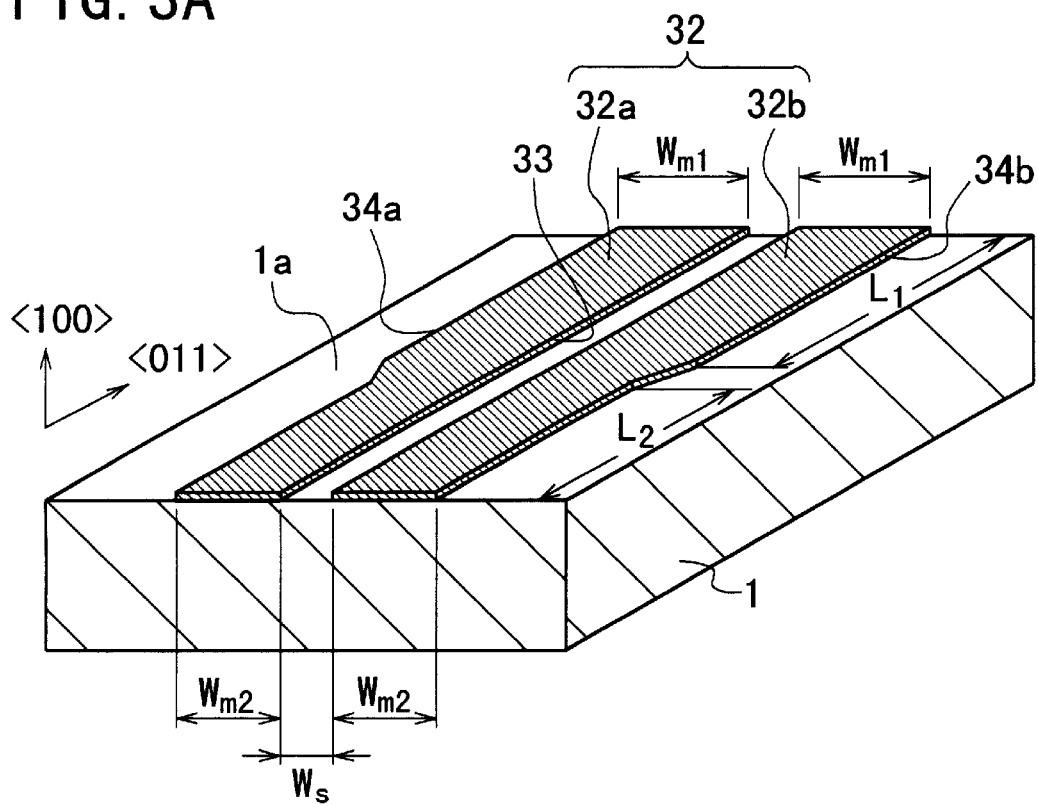
FIGS. 3A to 3E are schematic perspective views showing a method of fabricating a photonic semiconductor device according to a second embodiment of the present invention, respectively.

First, as shown in FIG. 3A, an n-type InP substrate 1 having a (100)-oriented flat surface 1a is prepared. Then, a $SiO_2$ layer (not shown) with a thickness of 150 nm is deposited on the surface 1a by a known thermal CVD process. Using a patterned photoresist film (not shown) obtained by known photolithography, the $SiO_2$ layer is patterned by wet etching, thereby forming a growth-inhibiting mask layer 2 made of $SiO_2$ on the flat surface 1a of the substrate 1. The state at this stage is shown in FIG. 3A.

The above process steps are the same as those in the first embodiment.

The growth-inhibiting mask layer 32 has a pair of strip-like masking parts 32a and 32b extending along the <011> direction and a strip-shaped opening 3 located between the masking parts 32a and 32b. The opening 33 extends along the same direction as that of the parts 2a and 2b. The mask layer 32 further has two openings 34a and 34b located at each side of the opening 33. The flat surface 1a of the substrate 1 is exposed from the masking layer 32 through the openings 33, 34a, and 34b.

The elongated masking parts 32a and 32b and the elongated opening 33 are different in width and length from one each other in a laser region and an optical modulator region. Here, in the laser region, the masking parts 32a and 32b have an equal width $W_{m1}$ of 18 μm and an equal length $L_1$ of 500 μm. In the optical modulator region, the masking parts 32a and 32b have an equal width $W_{m2}$ of 5 μm and an equal length $L_2$ of 200 μm. The total length of the photonic semiconductor device is 700 μm along the <011> direction. The elongated opening 33, which is kept constant in width over its whole length, has a width $W_s$ of 1.5 μm.

Figure 3B:
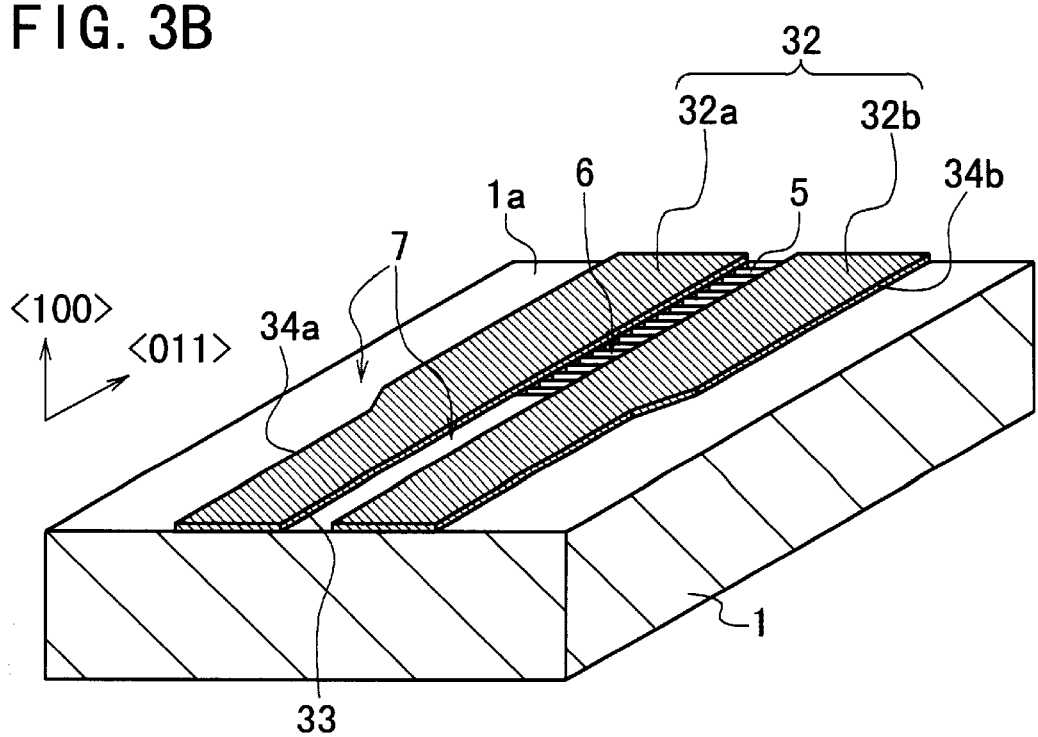

Subsequently, an EB resist film (not shown) is formed on the whole surface 1a of the substrate 1 while covering the masking layer 32. The EB resist film is patterned by known EB exposure and development processes. Using the EB resist film thus patterned, a corresponding part of the surface 1a of the substrate 1 is directly and selectively etched by a wet etching process through the opening 33 of the mask layer 32, forming parallel grooves on the elongated region of the surface 1a exposed through the elongated opening 33 of the mask layer 32. The grooves, which are arranged at regular intervals along the surface 1a in the laser region, extend perpendicular to the elongated opening 33 and the <011> direction. These grooves constitute a diffraction grating 5, as shown in FIG. 3B. Thus, the diffraction grating 5 is selectively formed on the elongated region of the surface 1a through the opening 33. The state at this stage is shown in FIG. 3B.

The area of the surface 1a on which the grating 5 is formed is termed a "grooved area 6" and the remaining area of the surface 1a on which the grating 5 is not formed is termed a "flat area 7".

Here, the grooved area 6 has a length equal to $L_1$ (=500 μm) along the <011> direction and the flat area 7 has a length equal to $L_2$ (=200 μm) along the same direction, resulting in the total length of the photonic semiconductor device being 900 μm along the <011> direction. The period of the grooves forming the grating 5 is 241.7 nm.

Figure 3C:
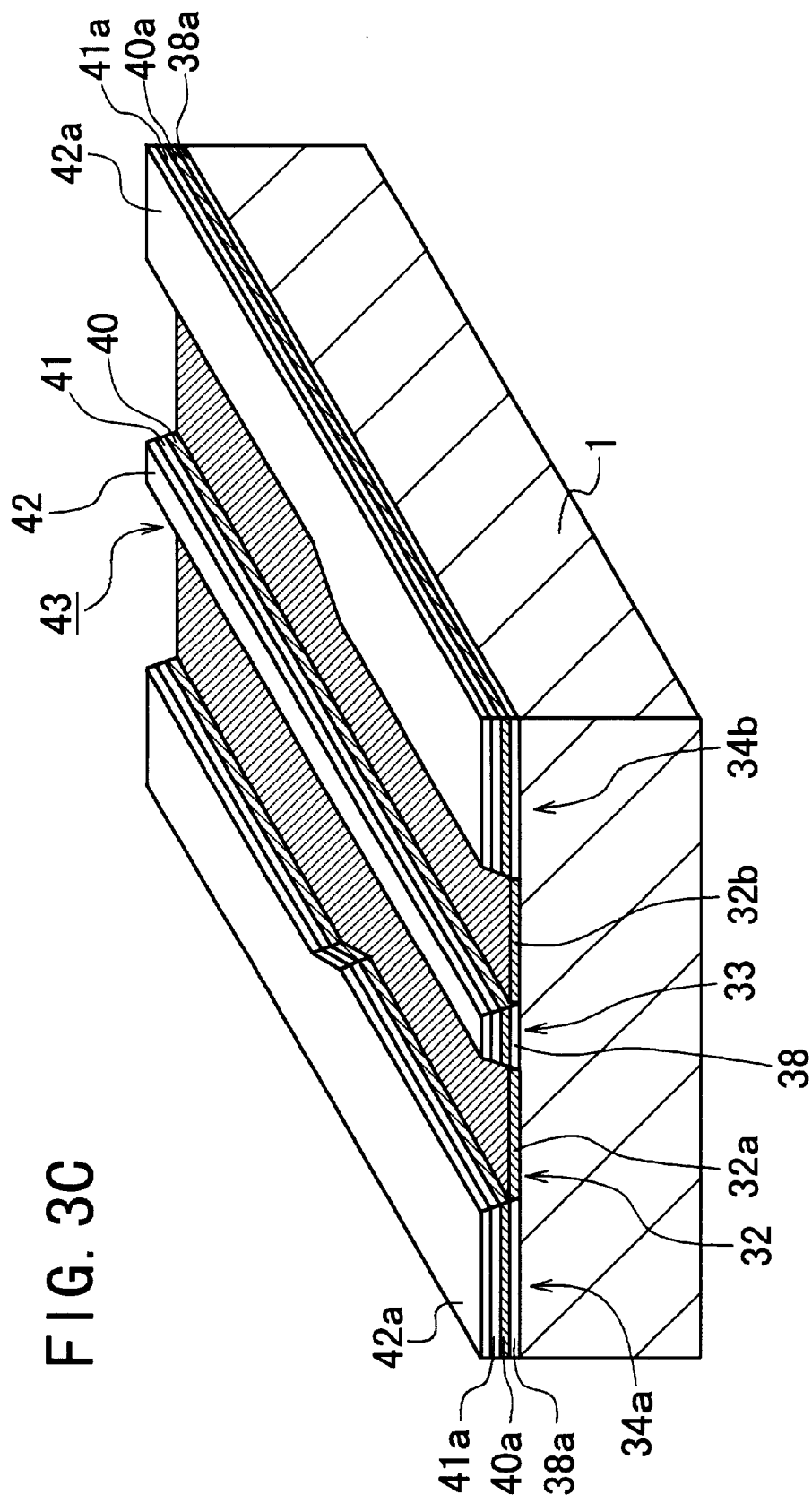

Further, by a selective MOVPE process using the mask layer 32, an n-type InGaAsP guiding layer 38, an undoped InGaAsP MQW active layer 40, an undoped InGaAsP optically confining layer 41, and a p-type InP cladding layer 42 are selectively and successively grown on the exposed flat surface 1a of the substrate 1 from the mask layer 32. Thus, as shown in FIG. 3C, a multilayer optical waveguide 43 with a mesa structure is formed on the elongated region of the surface 1a of the substrate 1 exposed through the opening 33. This MOVPE process is performed in a growth chamber held at a pressure of 75 Torr at a growth temperature of 625° C.

The n-type InGaAsP guiding layer 38 has a thickness of 0.1 μm, a carrier concentration of $5 \times 10^{17}$ cm$^{-3}$, and a bandgap wavelength of 1.13 μm. The undoped InGaAsP optically confining layer 41 has a thickness of 60 nm, a carrier concentration of $5 \times 10^{17}$ cm$^{-3}$, and a bandgap wavelength of 1.15 μm. The p-type InP cladding layer 42 has a thickness of 0.1 μm and a carrier concentration of $5 \times 10^{17}$ cm$^{-3}$.

The undoped InGaAsP MQW active layer 40 is formed by InGaAsP well sublayers and InGaAsP barrier layers stacked alternately at eight periods. Each of the well sublayers has a thickness of 6 nm and a strain of 0.5%. Each of the barrier sublayers has a thickness of 8 nm. Each of the well sublayers has an equal bandgap wavelength of 56 μm in the laser and modulator regions. Each of the barrier sublayers has a bandgap wavelength of 1.13 μm in the laser region and that of 1.13 μm in the modulator region.

As seen from FIG. 3C, an n-type InGaAsP layer 38a, an undoped InGaAsP MQW layer 40a, an undoped InGaAsP layer 41a, and a p-type InP layer 42a are selectively grown on the exposed areas of the surface 1a from the openings 34a and 34b of the mask layer 32, along with the optical waveguide 33. These layers 38a, 40a, 41a, and 42a are equal in configuration and composition to the layers 38, 40, 41, and 42 forming the waveguide 33, respectively.

Using a patterned photoresist film (not shown) by photolithography, the mask layer 32 is selectively etched by wet etching to increase the width $W_s$ of the strip-shaped opening 33 to 7 μm over its whole length. Thus, the surface 1a of the substrate 1 is partially exposed through strip-shaped windows formed at each side of the optical waveguide 33.

Figure 3D:
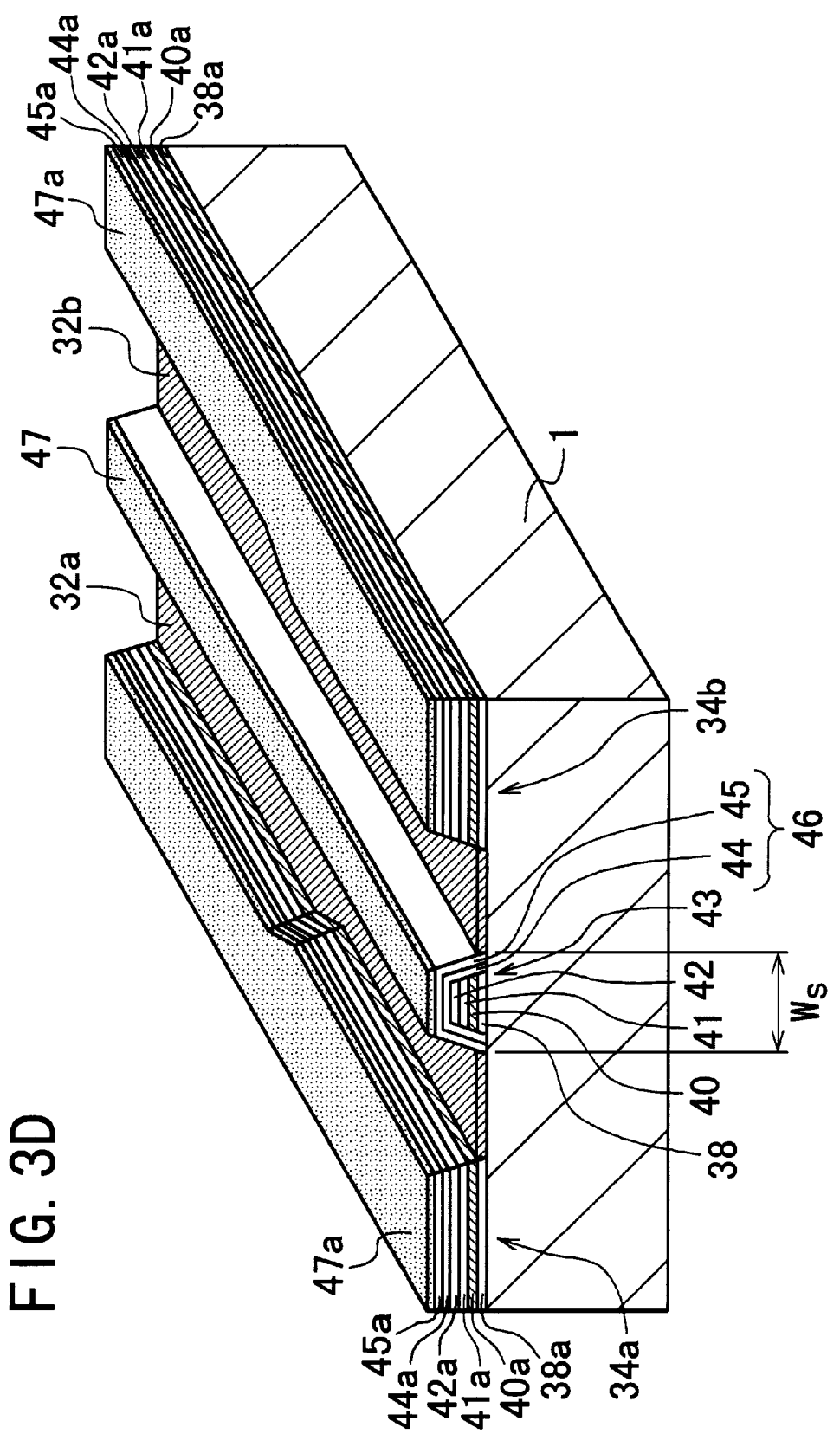

Then, using the mask layer 32 thus widened, a p-type InP layer 44 and a p-type InP layer 45 are selectively and successively grown by a selective MOVPE process on the exposed surface 1a of the substrate 1 through the strip-shaped windows, as shown in FIG. 3D. The two InP layers 44 and 45 constitute a buried layer 46. This MOVPE process is performed in the same growth chamber held as above at the same pressure of 75 Torr at the same growth temperature of 625° C. These layers 44 and 45 (i.e., the buried layer 46) cover only the entire surface of the waveguide 43. The p-type InP layer 44 has a thickness of 0.3 μm and a carrier concentration of $5 \times 10^{17}$ cm$^{-3}$. The p-type InP layer 45 has a thickness of 1.5 μm and a carrier concentration of $1 \times 10^{18}$ cm$^{-3}$.

Subsequently, using the same mask layer thus widened, a InGaAs cap layer 47 is selectively grown on the buried layer 46 by a selective MOVPE process under the same condition. The InGaAs cap layer 47 has a thickness of 0.2 μm and a carrier concentration of $5 \times 10^{18}$ cm$^{-3}$.

Thus, a mesa-stripe structure having a width of 10 μm is completed on the flat surface 1a of the substrate 1, and the SiO$_2$ mask layer 32 is removed by etching. The state at this stage is shown in FIG. 3D.

As seen from FIG. 3D, a p-type InP layer 44a and a p-type InP layer 45a are selectively grown on the InP layer 42a over the openings 34a and 34b of the mask layer 32, along with the p-type InP layers 44a and 45a forming the buried layer 46. A InGaAsP layer 47a is selectively grown on the InP layer 45a. These layers 44a, 45a, and 47a are equal in configuration and composition to the layers 44, 45, and 47, respectively.

Subsequently, a SiO$_2$ layer 48 with a thickness of 350 nm is deposited on the layered structure of the substrate 1 shown in FIG. 3D by a thermal CVD process. The SiO$_2$ layer 48 is then patterned by a wet etching process using a patterned photoresist film (not shown) obtained by a photolithography technique, thereby forming rectangular contact windows 49a and 49b in the layer 48. The windows 49a and 49b expose the top of the mesa-stripe structure.

Following this, a Ti film with a thickness of 100 nm and a Au film with a thickness of 300 nm are successively deposited by sputtering on the SiO$_2$ layer 48 thus patterned. The Ti and Au films are simultaneously patterned by wet etching using a photoresist film patterned by a photolithography, forming two pad-shaped p-side electrodes 50 and 51 on the SiO$_2$ layer 48. The p-side electrode 50, which is located in the laser region 61, is contacted and electrically connected with the InGaAs cap layer 47 through the window 49b of the SiO$_2$ layer 48. The p-side electrode 51, which is located in the modulator region 62, is contacted and electrically connected with the InGaAs cap layer 47 through the window 49a of the SiO$_2$ layer 48.

The back surface of the substrate 1, which is opposite to the flat surface 1a, is polished until the resultant thickness of the substrate 1 is equal to a desired value of 100 μm. A Ti film with a thickness of 100 nm ant a Au film with a thickness of 300 nm are successively deposited on the back surface by sputtering. The Ti and Au films are simultaneously patterned by wet etching using a photoresist film patterned by a photolithography, forming an n-side electrode 52. The n-side electrode 52 is contacted and electrically connected with the back surface of the substrate 1.

Thereafter, the substrate 1 having the above-described mesa-stripe structure is sintered in a N$_2$ atmosphere, completing the semiconductor laser device.

Figure 3E:
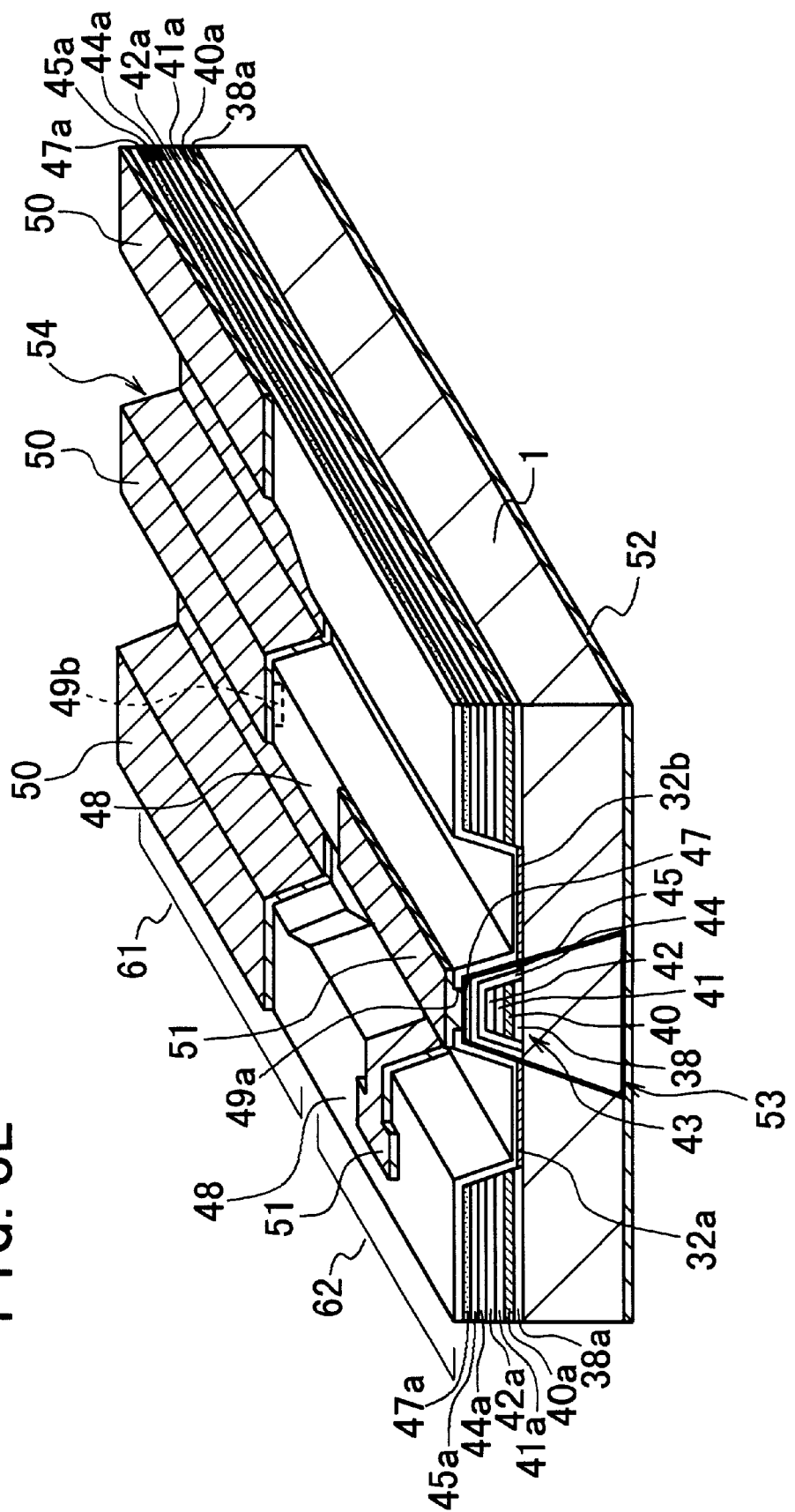

Only one laser device is provided on the substrate 1 in the above explanation and FIGS. 3A to 3E for the sake of simplification of description. However, practically, a lot of same laser devices are provided on the same substrate 1. Therefore, finally, the substrate 1 is cloven along the specific lines to separate the individual laser devices from one another. In each of the laser devices, the end face of the waveguide 43 in the laser region 61 (at the near side of the diffraction grating 5) is covered with a high-reflectance film 54 with a reflectance of 90% and at the same time, the end face of the waveguide 43 in the modulator region 62 (at the far side of the diffraction grating 5) is covered with a low-reflectance film 53 with a reflectance of 0.1%. Thus, the DFB-type semiconductor laser device having the optical modulator element and the diffraction grating 5 at the part of the waveguide 43 shown in FIG. 3E is completed.

With the method of fabricating a photonic semiconductor device according to the second embodiment of the present invention, because of the same reason as explained in the first embodiment, the performance of the fabricated photonic semiconductor device is prevented from being degraded without lowering the fabrication yield of the device.

For example, even if the waveguide 43 does not have a specific, desired value, neither performance degradation of the laser nor its fabrication yield lowering will occur. Also, since the width of the waveguide 43 is not discontinuously changed at the boundary of the grooved and flat areas 6 and 7, scattering and reflection of the propagating light in the waveguide 43 are not generated due to this discontinuity of the width. Accordingly, the optically coupling loss of the laser and optical modulator elements due to the reflection and/or scattering of the light can be suppressed.

To confirm the advantages of the method according to the second embodiment, the inventor practically fabricated the photonic semiconductor device in the same way as above-described and tested. The result of the test is as follows.

The single-mode yield on the laser oscillation spectrum was 70%, which accorded with an estimated value obtained in consideration of the random phase effect at the end faces of the waveguide 43. The optical coupling efficiency between the laser and optical modulator elements was approximately equal to 100%. The optical output of the device was 10 mW when the threshold current for laser oscillation was set as 8 mA and 100 mA. The extinction ratio of the device was 15 dB or higher when a reverse bias voltage of 2 V was applied across the optical modulator element. As a result, the device fabricated by the method according to the second embodiment was approximately equal in these characteristics to the device obtained in the prior-art method shown in FIGS. 1A and 1B.

Moreover, a data transmission test was performed under the condition that the modulation rate was set as 2.5 Gb/sec and a normal optical fiber having an overall length of 150 km was connected to the fabricated device. As a result, the penalty was 1 dB or lower, which meant that the fabricated device exhibited a good performance.

In the above-described first and second embodiments, the flat surface 1*a* of the semiconductor substrate 1 is directly etched to form the diffraction grating 5. However, the present invention is not limited to this. The grating 5 may be formed by producing graves in any layer or layers formed on a flat surface of a semiconductor substrate, in which the masking layer 2 or 32 is formed on the layer or layers having the graves.

Also, the optical waveguide is formed linear or strip-shaped in the above-described first and second embodiments. However, it is needless to say that the plan shape and cross-section of the optical waveguide may be optional.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A method of fabricating a photonic semiconductor device, comprising:
   (a) preparing a semiconductor substrate having a flat surface;
   (b) forming a dielectric mask layer on said surface of said substrate, said mask layer having an elongated opening, and an elongated region of said surface of said substrate being exposed from said mask layer through said elongated opening;
   (c) forming a diffraction grating on a part of said elongated region of said surface of said substrate through said opening of said mask layer;
   (d) successively and selectively forming semiconductor layers on said elongated region of said surface of said substrate by a selective MOVPE process through said opening of said mask layer, thereby forming a multi-layer, elongated optical waveguide on said surface of said substrate, at least part of said waveguide being located on said part of said elongated region of said surface of said substrate and being contacted with said diffraction grating; and
   (e) after said successively and selectively forming semiconductor layers, removing said mask layer from said surface of said substrate.

2. The method as claimed in claim 1, wherein said optical waveguide is formed in such a way that only said part of said waveguide is located on said diffraction grating, and said part of said waveguide located on said grating serves as part of a laser element.

3. The method as claimed in claim 1, wherein said optical waveguide is formed in such a way that only said part of said waveguide is located on said diffraction grating and wherein said part of said waveguide located on said grating serves as part of a first photonic element and a part of said waveguide located outside said grating serves as part of a second photonic element,
   wherein said first photonic element comprises a laser element and said second photonic element comprises an element other than a laser element.

4. The method as claimed in claim 1, wherein said forming said dielectric mask layer comprises:
   (i) forming a dielectric layer on said flat surface of said substrate;
   (ii) forming a patterned resist film on said dielectric layer formed on said surface of said substrate; and
   (iii) etching said dielectric layer using said patterned resist film as a mask.

5. The method as claimed in claim 1, wherein said substrate comprises an InP substrate and said dielectric mask layer comprises one of an oxide and a nitride of silicon.

6. The method as claimed in claim 1, wherein said elongated opening of said dielectric mask layer has a width of approximately 2 $\mu$m or less.

7. A method of fabricating a photonic semiconductor device having a diffraction grating and an optical waveguide on a same flat surface of a semiconductor substrate, at least part of said optical waveguide being contacted with said diffraction grating; said method comprising:
   (a) forming a dielectric mask layer on said flat surface of said substrate, said mask layer having an elongated opening, and an elongated region of said surface of said substrate being exposed from said mask layer through said elongated opening;
   (b) forming a diffraction grating on a part of said elongated region of said surface of said substrate through said opening of said mask layer; and
   (c) forming an optical waveguide on said elongated region of said surface of said substrate by a selective MOVPE process using said mask layer, at least part of said waveguide being located on said part of said elongated region of said surface of said substrate and being contacted with said diffraction grating.

8. The method as claimed in claim 7, wherein said optical waveguide is formed in such a way that only said part of said waveguide is located on said diffraction grating in said forming of said optical waveguide, and
   wherein said part of said waveguide located on said grating serves as part of a laser element.

9. The method as claimed in claim 7, wherein said optical waveguide is formed in such a way that part of said waveguide is located on said diffraction grating in said forming of said optical waveguide,
   wherein said part of said waveguide located on said grating serves as part of a first photonic element and a part of said waveguide located outside said grating serves as part of a second photonic element; and
   wherein said first photonic element comprises a laser element and said second photonic element comprises an element other than a laser element.

10. The method according to claim 1, wherein said waveguide is formed to have a uniform width along said elongated region of said semiconductor device.

11. The method according to claim 1, wherein said dielectric mask layer is formed to have a uniform thickness along said elongated region of said semiconductor device.

12. The method according to claim 1, wherein said semiconductor device is fabricated to have a length of 300 μm or less.

13. The method according to claim 1, wherein said semiconductor device is fabricated to have secondary intermodulation distortion of −65 dBc or less at an optical output of 30 mW.

14. The method according to claim 1, wherein said semiconductor device is fabricated so that a threshold current for laser oscillation is at least 10 mA and a slope efficiency is at least 0.58 W/A.

15. The method according to claim 1, wherein said diffraction grating is formed only on said flat surface of said semiconductor substrate within said opening of said mask layer.

* * * * *